United States Patent
Yamaguchi et al.

(10) Patent No.: US 11,843,027 B2
(45) Date of Patent: Dec. 12, 2023

(54) METHOD OF MANUFACTURING SEMICONDUCTOR DEVICE

(71) Applicant: Tokyo Electron Limited, Tokyo (JP)

(72) Inventors: Tatsuya Yamaguchi, Nirasaki (JP); Syuji Nozawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 254 days.

(21) Appl. No.: 17/237,821

(22) Filed: Apr. 22, 2021

(65) Prior Publication Data

US 2021/0336000 A1    Oct. 28, 2021

(30) Foreign Application Priority Data

Apr. 28, 2020    (JP) .................................. 2020-078905

(51) Int. Cl.
*H01L 21/76* (2006.01)
*H01L 29/06* (2006.01)
*H01L 21/3105* (2006.01)

(52) U.S. Cl.
CPC .... *H01L 29/0649* (2013.01); *H01L 21/31058* (2013.01)

(58) Field of Classification Search
CPC .................... H01L 29/0649; H01L 21/31058
See application file for complete search history.

(56) References Cited

U.S. PATENT DOCUMENTS

2020/0020523 A1\*   1/2020   Kikuchi .............. H01L 21/3081
2021/0296276 A1\*   9/2021   Huang .................... H01L 25/50

FOREIGN PATENT DOCUMENTS

JP          2012-054307 A      3/2012

\* cited by examiner

*Primary Examiner* — Dale E Page
*Assistant Examiner* — Colleen E Snow
(74) *Attorney, Agent, or Firm* — Armstrong Teasdale LLP

(57) ABSTRACT

A method of manufacturing a semiconductor device is disclosed. The method includes laminating a thermally decomposable organic material on a substrate by supplying a material gas into a container in which the substrate having a first recess and a second recess, which has a wider width than a width of the first recess, are formed, fluidizing the organic material laminated on the substrate by heating the substrate to a first temperature, and removing the organic material laminated in the second recess.

9 Claims, 15 Drawing Sheets

METHOD OF MANUFACTURING SEMICONDUCTOR DEVICE

CROSS-REFERENCE TO RELATED APPLICATION

This application is based upon and claims the benefit of priority from Japanese Patent Application No. 2020-078905, filed on Apr. 28, 2020, the entire contents of which are incorporated herein by reference.

TECHNICAL FIELD

Various aspects and embodiments of the present disclosure relate to a method of manufacturing a semiconductor device.

BACKGROUND

For example, Patent Document 1 below discloses, regarding a semiconductor device having a multilayer structure, a technique for reducing a relative dielectric constant of an interlayer insulating film by forming an air gap in the interlayer insulating film. In this technique, when burying the interlayer insulating film in a recess of a substrate, a space (void) that causes a burying failure is formed in the recess, and the formed void is used as an air gap.

PRIOR ART DOCUMENT

Patent Document

Patent Document 1: Japanese Laid-Open Patent Publication No. 2012-54307

SUMMARY

A method of manufacturing a semiconductor device is disclosed. The method includes laminating a thermally decomposable organic material on a substrate by supplying a material gas into a container in which the substrate having a first recess and a second recess, which has a wider width than a width of the first recess, are formed, fluidizing the organic material laminated on the substrate by heating the substrate to a first temperature, and removing the organic material laminated in the second recess.

BRIEF DESCRIPTION OF DRAWINGS

The accompanying drawings, which are incorporated in and constitute part of the specification, illustrate embodiments of the present disclosure, and together with the general description given above and the detailed description of the embodiments given below, serve to explain the principles of the present disclosure.

DETAILED DESCRIPTION

Figure 1:
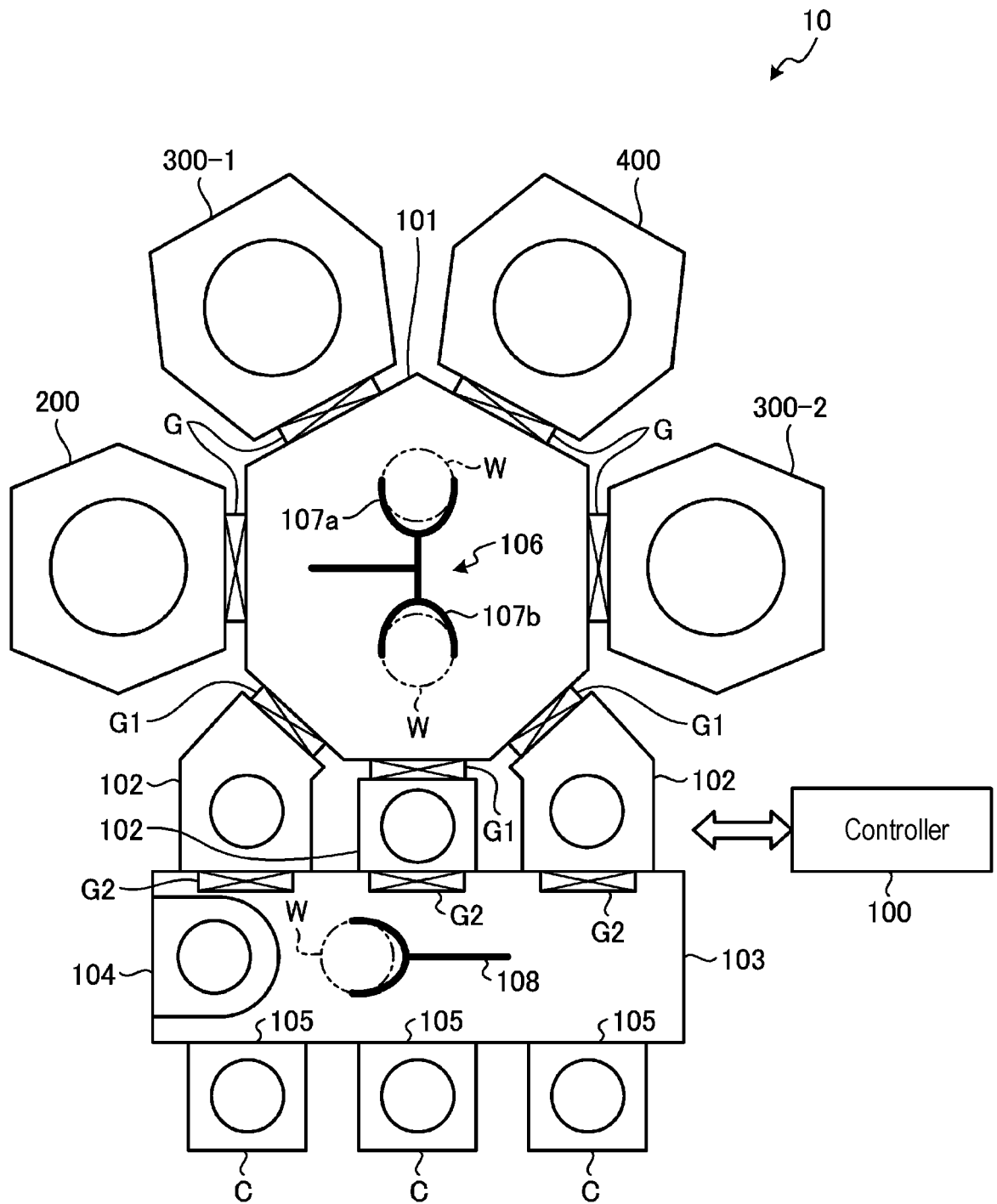
FIG. 1 is a diagram illustrating configuration of an example of a manufacturing system according to an embodiment of the present disclosure.

Reference will now be made in detail to various embodiments, examples of which are illustrated in the accompanying drawings. In the following detailed description, numerous specific details are set forth in order to provide thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a method of manufacturing a semiconductor device disclosed herein will be described in detail with reference to the drawings. The method of manufacturing a semiconductor device disclosed herein is not limited by the following embodiments.

A shape and size of a void formed as a result of the burying failure depend on the width, depth, or the like of a recess. For example, when the width of the recess is narrow, a large void is formed in a lower portion of the recess, but when the width of the recess is wide, almost no void is formed in the lower portion of the recess. In addition, the shape and size of the void formed in a recess may vary depending on a location of the recess on a substrate and a location of the recess in a semiconductor manufacturing apparatus. Therefore, it is difficult to form a void having a desired shape and size in a recess having an arbitrary shape.

Therefore, laminating a thermally decomposable organic material in a recess of a substrate, laminating a sealing film on the organic material, and then heating the substrate to desorb the organic material that is thermally decomposed from the recess through the sealing film can be considered. As a result, it is possible to form an air gap having a shape corresponding to a shape of the organic material between the recess and the sealing film.

Meanwhile, on a substrate where a spacing between wirings, for example, signal lines or ground lines, is narrow, an air gap is required to reduce a parasitic capacitance between the wirings. However, in such an area, a ratio of height to width of the air gap increases. Therefore, mechanical strength of a structure in which the air gap is formed does not become so weak.

On the other hand, where a wiring spacing is wide, when an air gap is formed, the ratio of height to width of the air gap decreases. Thus, the mechanical strength of the structure becomes weaker than that of the structure in which an air gap is formed where the wiring spacing is narrow. At first, where the wiring spacing is wide, there are many cases where a parasitic capacitance between wirings can be lowered without providing an air gap between the wirings. Thus, depending on the width of the recess, it may not be preferable to have an air gap formed.

In addition, in processing a semiconductor device, in order to process an area having a wide wiring spacing, a protective film may be formed in an area having a narrow wiring spacing. In such a case, completely laminating the protective film and selectively removing the protective film from the area in which the wiring spacing is wide can be considered. However, when an amount of the protective film formed in an area where the wiring spacing is wide can be suppressed, wasteful consumption of a material gas for forming the protective film can be suppressed.

Therefore, the present disclosure provides a technique for selectively forming a film in a recess having a narrow width rather than in a recess having a wide width.

[Configuration of Manufacturing System 10]

FIG. 1 is a diagram illustrating configuration of an example of a manufacturing system 10 according to an embodiment of the present disclosure. The manufacturing system 10 includes a laminating apparatus 200, a heating apparatus 300-1, a plasma processing apparatus 400, and a heating apparatus 300-2. The manufacturing system 10 is a multi-chamber-type vacuum processing system. The manufacturing system 10 uses the laminating apparatus 200, the heating apparatus 300-1, the plasma processing apparatus 400, and the heating apparatus 300-2 to form an air gap in a substrate W where an element used for a semiconductor device is formed. The heating apparatus 300-1 and the heating apparatus 300-2 have the same configuration. Hereinafter, when each of the heating apparatus 300-1 and the heating apparatus 300-2 is generally referred to without distinguishing therebetween, it will be referred to as a "heating apparatus 300."

The laminating apparatus 200 laminates a film of a thermally decomposable organic material on a surface of the substrate W in which recesses having different widths are formed. In the present embodiment, the thermally decomposable organic material is a polymer having a urea bond generated through polymerization of multiple types of monomers. The heating apparatus 300-1 fluidizes the organic material laminated in the recesses of the substrate W by heating the substrate W to a first temperature. Then, the heating apparatus 300-1 removes the organic material laminated near the recesses in the substrate W and the organic material laminated at a bottom of a recess having a wide width, by heating the substrate W to a second temperature which is higher than the first temperature. The plasma processing apparatus 400 uses microwave plasma to laminate a sealing film on the organic material laminated in the recesses of the substrate W. The heating apparatus 300-2 thermally decomposes the organic material of a lower layer of the sealing film by heating the substrate W to the second temperature which is higher than the first temperature, and causes the organic material of the lower layer of the sealing film to be desorbed through the sealing film. As a result, air gaps are formed between the sealing film and the recesses.

The laminating apparatus 200, the heating apparatus 300-1, the plasma processing apparatus 400, and the heating apparatus 300-2 are connected to four side walls of a vacuum transport chamber 101 having a heptagonal planar shape via gate valves G, respectively. Three load lock chambers 102 are connected to the other three side walls of the vacuum transport chamber 101 via gate valves G1, respectively. Each of the three load lock chambers 102 is connected to an atmospheric transport chamber 103 via a gate valve G2.

Inside of the vacuum transport chamber 101 is exhausted by a vacuum pump, and is maintained at a predetermined degree of vacuum. In the vacuum transport chamber 101, a transport mechanism 106, such as a robot arm, is provided. The transport mechanism 106 transports substrates W among the laminating apparatus 200, the heating apparatus 300-1, the plasma processing apparatus 400, the heating apparatus 300-2, and each load lock chamber 102. The transport mechanism 106 has two arms 107a and 107b, which are independently movable.

A side surface of the atmospheric transport chamber 103 is provided with multiple ports 105, in each of which a carrier (e.g., a front-opening unified pod (FOUP)) C for accommodating substrates W is mounted. In addition, on a side wall of the atmospheric transport chamber 103, an alignment chamber 104 is provided so as to perform alignment of a substrate W. A downflow of clean air is formed in the atmospheric transport chamber 103.

A transport mechanism 108, such as a robot arm, is provided in the atmospheric transport chamber 103. The transport mechanism 108 transports substrates W among each carrier C, each load lock chamber 102, and an alignment chamber 104.

A controller 100 has a memory, a processor, and an input and output interface. The memory stores, for example, programs executed by the processor and recipes including conditions for each process. The processor executes a program read from the memory and controls each part of the manufacturing system 10 via the input/output interface based on a recipe stored in the memory.

[Configuration of Laminating Apparatus 200]

Figure 2:
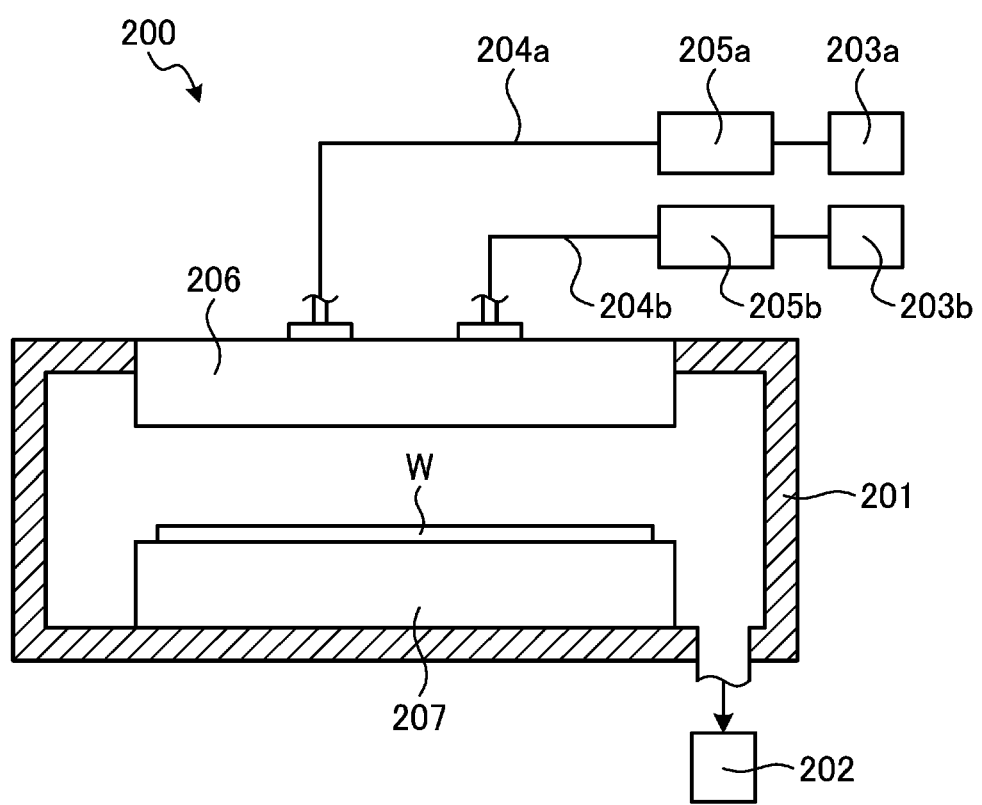
FIG. 2 is a schematic diagram illustrating an example of a laminating apparatus according to an embodiment of the present disclosure.

FIG. 2 is a schematic diagram illustrating an example of the laminating apparatus 200 according to an embodiment of the present disclosure. The laminating apparatus 200 includes a container 201, an exhaust apparatus 202, a shower head 206, and a placement stage 207. In the present embodiment, the laminating apparatus 200 is, for example, a chemical vapor deposition (CVD) apparatus.

The exhaust apparatus 202 exhausts a gas in the container 201. Inside of the container 201 is controlled to a vacuum atmosphere of a predetermined pressure by the exhaust apparatus 202.

Multiple types of raw material monomers are supplied to the container 201 through the shower head 206. The multiple types of raw material monomers are examples of a material gas. In the present embodiment, the multiple types of raw material monomers are, for example, isocyanate and amine. A raw material supply source 203a configured to contain isocyanate in a liquid state is connected to the shower head 206 via a supply pipe 204a. In addition, a raw material supply source 203b configured to contain amine in a liquid state is connected to the shower head 206 via a supply pipe 204b.

An isocyanate liquid supplied from the raw material supply source 203a is vaporized by a vaporizer 205a disposed in the supply pipe 204a. An isocyanate vapor vaporized by the vaporizer 205a is introduced into the shower head 206, which is a gas ejection device, through the supply pipe 204a. In addition, an amine liquid supplied from the raw material supply source 203b is vaporized by a vaporizer 205b disposed in the supply pipe 204b. An amine vapor vaporized by the vaporizer 205b is introduced into the shower head 206 through the supply pipe 204b.

The shower head 206 is provided in, for example, an upper portion of the container 201, and a large number of ejection holes are formed in a bottom surface thereof. The shower head 206 ejects the isocyanate vapor and the amine vapor, which are introduced through the supply pipe 204a and the supply pipe 204b, into the container 201 in a form of a shower from separate ejection holes, respectively.

A placement stage 207 having a temperature control mechanism (not illustrated) is provided in the container 201. A substrate W having a surface in which recesses with different widths are formed is placed on the placement stage 207. The placement stage 207 controls, by using a temperature control mechanism, the temperature of the substrate W to be a temperature suitable for vapor deposition polymerization of raw material monomers, which are respectively supplied from the raw material supply source 203a and the raw material supply source 203b. The temperature suitable for vapor deposition polymerization may be determined depending on the types of raw material monomers. The temperature suitable for vapor deposition polymerization is a temperature, for example, in a range of 60 degrees C. to 100 degrees C. A temperature in a range of 60 degrees C. to 100 degrees C. is an example of a third temperature.

By causing the vapor deposition polymerization reaction of two types of raw material monomers on the surface of the substrate W using the laminating apparatus 200, an organic material is laminated on a surface of the substrate W in which a recess is formed. When the two types of raw material monomers are isocyanate and amine, a polymer film of polyurea is laminated on the surface of the substrate W. The polymer of polyurea is an example of the thermally decomposable organic material.

[Structure of Heating Apparatus 300]

Figure 3:
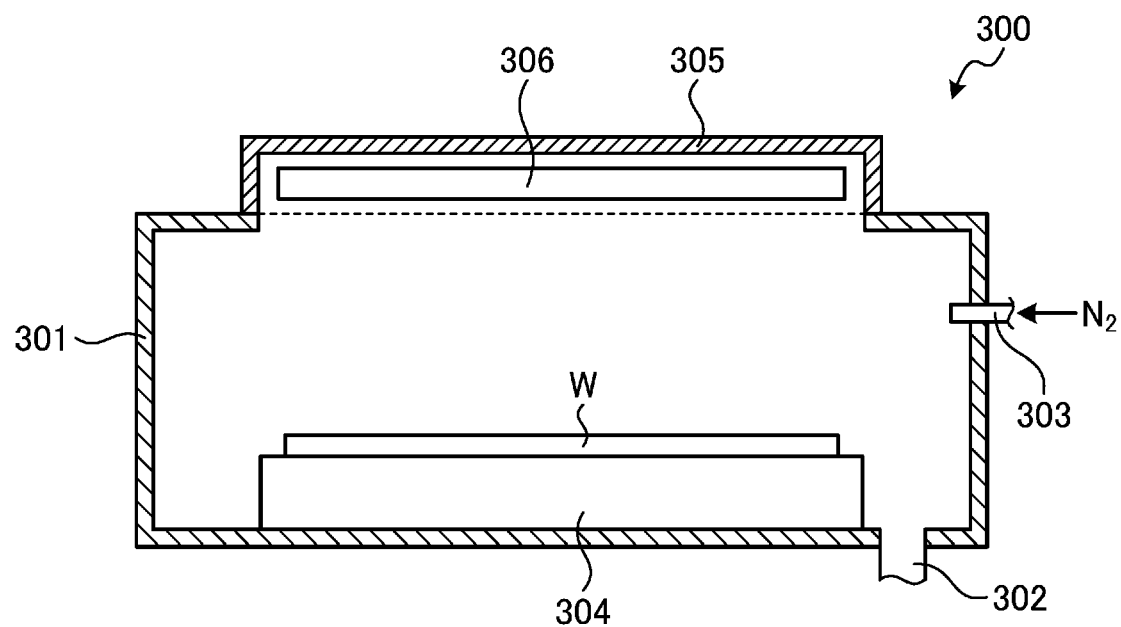
FIG. 3 is a schematic diagram illustrating an example of a heating apparatus according to an embodiment of the present disclosure.

FIG. 3 is a schematic diagram illustrating an example of a heating apparatus 300 according to an embodiment of the present disclosure. The heating apparatus 300 includes a container 301, an exhaust pipe 302, a supply pipe 303, a placement stage 304, a lamp house 305, and an infrared lamp 306.

The placement stage 304 on which a substrate W is placed is provided in the container 301. The lamp house 305 is provided at a position facing a surface of the placement stage 304 on which the substrate W is placed. The infrared lamp 306 is disposed in the lamp house 305.

An inert gas is supplied into the container 301 through the supply pipe 303. In the present embodiment, the inert gas is, for example, a $N_2$ gas.

In a state in which the substrate W is placed on the placement stage 304 and the inert gas is supplied into the container 301 through the supply pipe 303, the infrared lamp 306 is turned on, thereby heating the substrate having recesses, in which the organic material is laminated, to the first temperature. When the organic material laminated in a recess of the substrate W reaches the first temperature, the organic material on the substrate W is fluidized. The organic material laminated on a side wall of the recess is fluidized and flows to a bottom of the recess. When the organic material is polyurea, the first temperature is a temperature in a range of, for example, 180 degrees C. to 300 degrees C. Further, the heating time at the first temperature is a duration of time corresponding to the temperature. For example, at 180 degrees C., the heating time is 10 minutes or more and at 300 degrees C., for example, the heating time is within 30 seconds.

Then, when the substrate W is heated to a fourth temperature, which is the same temperature as or higher than the first temperature, some of the organic material is thermally decomposed into two types of raw material monomers. As a result, the organic material laminated near the recesses in the substrate W and the organic material laminated at the bottom of a recess with a wider width are removed. In a case in which the organic material is polyurea, when the organic material is heated to the fourth temperature, some of the organic material is depolymerized into isocyanate and amine which are raw material monomers. When the organic material is polyurea, the fourth temperature is a temperature in a range of, for example, 240 degrees C. to 300 degrees C.

[Plasma Processing Apparatus 400]

Figure 4:
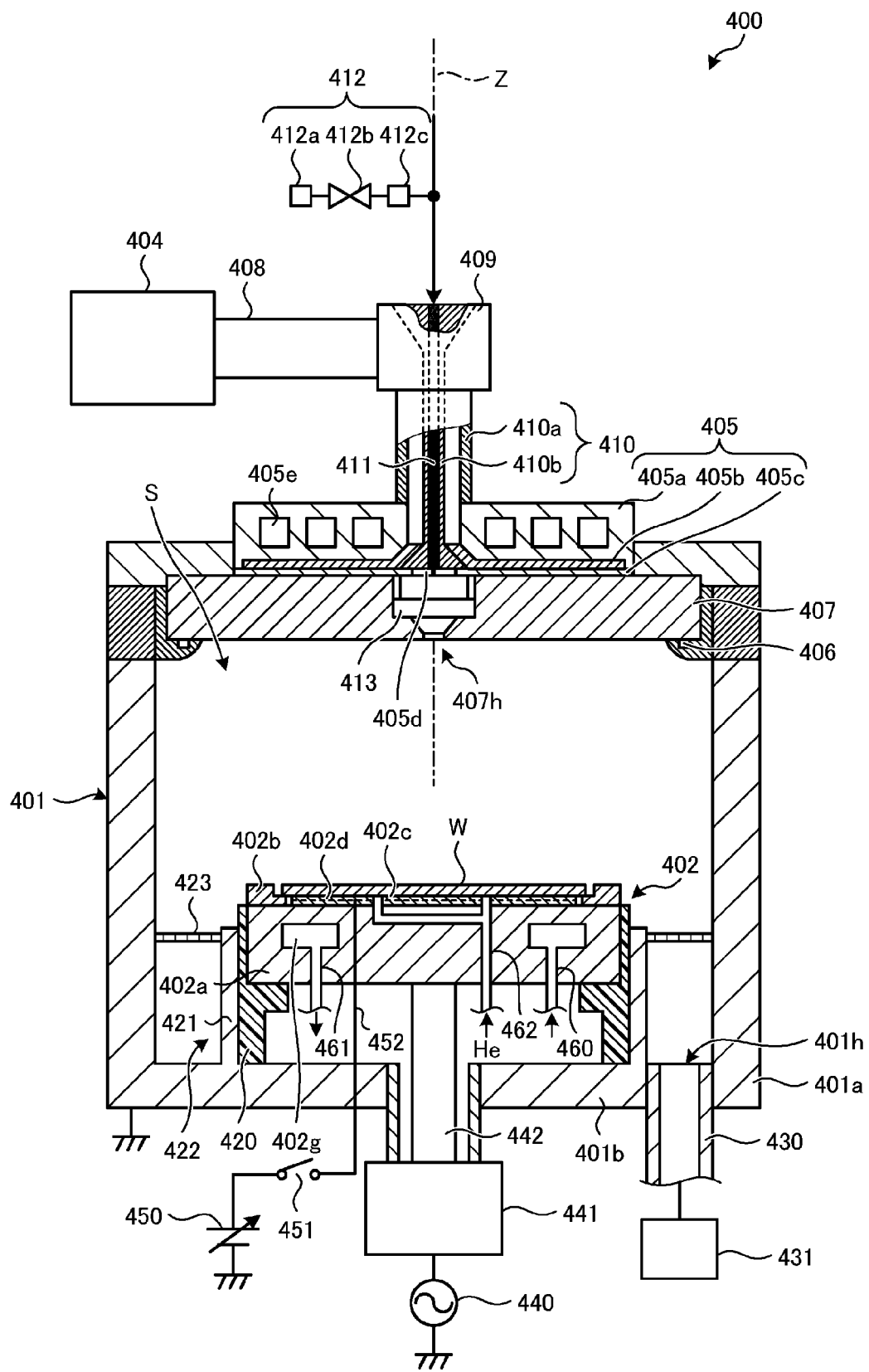
FIG. 4 is a schematic diagram illustrating an example of a plasma processing apparatus according to an embodiment of the present disclosure.

FIG. 4 is a schematic diagram illustrating an example of the plasma processing apparatus 400 according to an embodiment of the present disclosure. The plasma processing apparatus 400 includes a processing container 401 and a microwave output device 404.

The processing container 401 has a surface formed in a substantially cylindrical shape using, for example, anodized aluminum or the like, and provides a substantially cylindrical processing space S therein. The processing container 401 is grounded for safety. Further, the processing container 401 has a side wall 401a and a bottom 401b. A central axis of the side wall 401a is defined as an axis Z. The bottom 401b is provided at a lower end side of the side wall 401a. The bottom 401b is provided with an exhaust port 401h for exhausting gas. Further, an upper end of the side wall 401a is open.

A dielectric window 407 is provided at the upper end of the side wall 401a, and an opening in the upper end of the side wall 401a is sealed from above by the dielectric window 407. A bottom surface of the dielectric window 407 faces the processing space S. An O-ring 406 is disposed between the dielectric window 407 and the upper end of the side wall 401a.

A stage 402 is provided within the processing container 401. The stage 402 is provided so as to face the dielectric window 407 in the direction of the axis Z. A space between the stage 402 and the dielectric window 407 is the processing space S. A substrate W is placed on the stage 402.

The stage 402 has a base 402a and an electrostatic chuck 402c. The base 402a is formed in a substantially disk-like shape from a conductive material such as aluminum or the like. The base 402a is disposed in the processing container 401 such that a central axis thereof substantially coincides with the axis Z.

The base 402a is formed of a conductive material, and is supported by a tubular support 420 extending in a direction along the axis Z. A conductive tubular support 421 is provided on an outer circumference of the tubular support 420. The tubular support 421 extends from the bottom 401b of the processing container 401 towards the dielectric window 407 along the outer circumference of the tubular support 420. An annular exhaust path 422 is formed between the tubular support 421 and the side wall 401a.

An annular baffle plate 423, in which multiple through holes are formed in a thickness direction thereof, is provided in an upper portion of the exhaust path 422. The exhaust port 401h described above is provided below the baffle plate 423. An exhaust apparatus 431 including, for example, a vacuum pump, such as a turbo molecular pump, an automatic pressure control valve, or the like, is connected to the exhaust port 401h through an exhaust pipe 430. The exhaust apparatus 431 is capable of reducing a pressure in the processing space S to a predetermined degree of vacuum.

The base 402a can function as a high-frequency electrode. An RF power supply 440 is electrically connected to the base 402a via a feed rod 442 and a matching unit 441 to output an RF signal for RF bias. The RF power supply 440 supplies, to the base 402a, bias power having a predetermined frequency (e.g., 13.56 MHz) suitable for controlling the energy of ions drawn into the substrate W via the matching unit 441 and the feed rod 442.

The matching unit 441 accommodates a matcher for mainly matching an impedance from the RF power supply 440 with an impedance from a load, such as mainly an electrode, plasma, and the processing container 401. A blocking capacitor for self-bias generation is included in the matcher.

The electrostatic chuck 402c is provided on a top surface of the base 402a. The electrostatic chuck 402c attracts and holds the substrate W using an electrostatic force. The electrostatic chuck 402c has a substantially disk-like shape, and has a heater 402d buried therein. A heater power supply 450 is electrically connected to the heater 402d via a wire 452 and a switch 451. The heater 402d heats the substrate W placed on the electrostatic chuck 402c using the electric power supplied from the heater power supply 450. An edge ring 402b is provided on the base 402a. The edge ring 402b is disposed so as to surround the substrate W and the electrostatic chuck 402c. The edge ring 402b is sometimes referred to as a focus ring.

A flow path 402g is provided inside the base 402a. A coolant is supplied to the flow path 402g from a chiller unit (not illustrated) through a pipe 460. The coolant supplied into the flow path 402g is returned to the chiller unit through a pipe 461. A temperature of the base 402a is controlled by the coolant, the temperature of which is controlled by the chiller unit, circulating in the flow path 402g of the base 402a. A temperature of the substrate W on the electrostatic chuck 402c is controlled by the coolant flowing in the base 402a and the heater 402d in the electrostatic chuck 402c. In the present embodiment, the temperature of the substrate W is controlled to 200 degrees C. or lower (e.g., 150 degrees C.).

In addition, the stage 402 is provided with a pipe 462 for supplying a heat transfer gas, such as a He gas, between the electrostatic chuck 402c and the substrate W.

The microwave output device 404 outputs microwaves for exciting the processing gas supplied into the processing container 401. The microwave output device 404 generates microwaves having, for example, a frequency of 2.4 GHz.

The microwave output device 404 is connected to a mode converter 409 via a waveguide 408. The mode converter 409 converts a mode of the microwaves output from the microwave output device 404, and supplies the mode-converted microwaves to an antenna 405 through a coaxial waveguide 410.

The coaxial waveguide 410 includes an outer conductor 410a and an inner conductor 410b. The outer conductor 410a and the inner conductor 410b have a substantially cylindrical shape, and are disposed on top of the antenna 405 such that central axes of the outer conductor 410a and the inner conductor 410b substantially coincide with the axis Z.

The antenna 405 includes a cooling jacket 405a, a dielectric plate 405b, and a slot plate 405c. The slot plate 405c is formed of a conductive material in a substantially disk-like shape. The slot plate 405c is provided on the top surface of the dielectric window 407 such that a central axis of the slot plate 405c coincides with the axis Z. Multiple slot holes are formed in the slot plate 405c. The multiple slot holes are arranged in pairs around the central axis of the slot plate 405c.

The dielectric plate 405b is formed of a dielectric material, such as quartz, in a substantially disk-like shape. The dielectric plate 405b is disposed on the slot plate 405c such that a central axis of the dielectric plate 405b substantially coincides with the axis Z. The cooling jacket 405a is provided on the dielectric plate 405b.

The cooling jacket 405a has a surface formed of a material having conductivity, and has a flow path 405e formed therein. A coolant is supplied into the flow path 405e from a chiller unit (not illustrated). A lower end of the outer conductor 410a is electrically connected to an upper surface of the cooling jacket 405a. In addition, a lower end of the inner conductor 410b is electrically connected to the slot plate 405c through an opening formed in the center of the cooling jacket 405a and the dielectric plate 405b.

Microwaves propagating in the coaxial waveguide 410 propagate in the dielectric plate 405b and propagate to the dielectric window 407 from the multiple slot holes in the slot plate 405c. The microwaves propagating to the dielectric window 407 are radiated into the processing space S from a bottom surface of the dielectric window 407.

A gas pipe 411 is provided inside the inner conductor 410b of the coaxial waveguide 410. A through hole 405d, through which the gas pipe 411 is capable of passing, is formed in the center of the slot plate 405c. The gas pipe 411 extends through inside of the inner conductor 410b, and is connected to the gas supply 412.

The gas supply 412 supplies, to the gas pipe 411, a processing gas for laminating a sealing film on the substrate W. The gas supply 412 includes a gas supply source 412a, a valve 412b, and a flow controller 412c. The gas supply source 412a is a supply source of a processing gas for forming a sealing film. The processing gas includes a nitrogen-containing gas, a silicon-containing gas, and a rare gas. In the present embodiment, the nitrogen-containing gas is, for example, a $NH_3$ gas or $N_2$ gas, the silicon-containing gas is, for example, a $SiH_4$ gas, and the rare gas is, for example, a He gas or an Ar gas.

The valve 412b controls supplying and stopping the supply of the processing gas from the gas supply source 412a. The flow controller 412c is, for example, a mass flow controller, and controls a flow rate of the processing gas from the gas supply source 412a.

An injector 413 is provided in the dielectric window 407. The injector 413 injects the processing gas supplied through the gas pipe 411 into the processing space S through a through hole 407h formed in the dielectric window 407. The processing gas injected into the processing space S is excited by microwaves radiated into the processing space S through the dielectric window 407. As a result, the processing gas is plasmarized in the processing space S, and a sealing film is laminated on the substrate W by, for example, ions and radicals contained in the plasma. In the present embodiment, the sealing film is, for example, a silicon nitride film.

[Method of Forming Air Gap]

Figure 5:
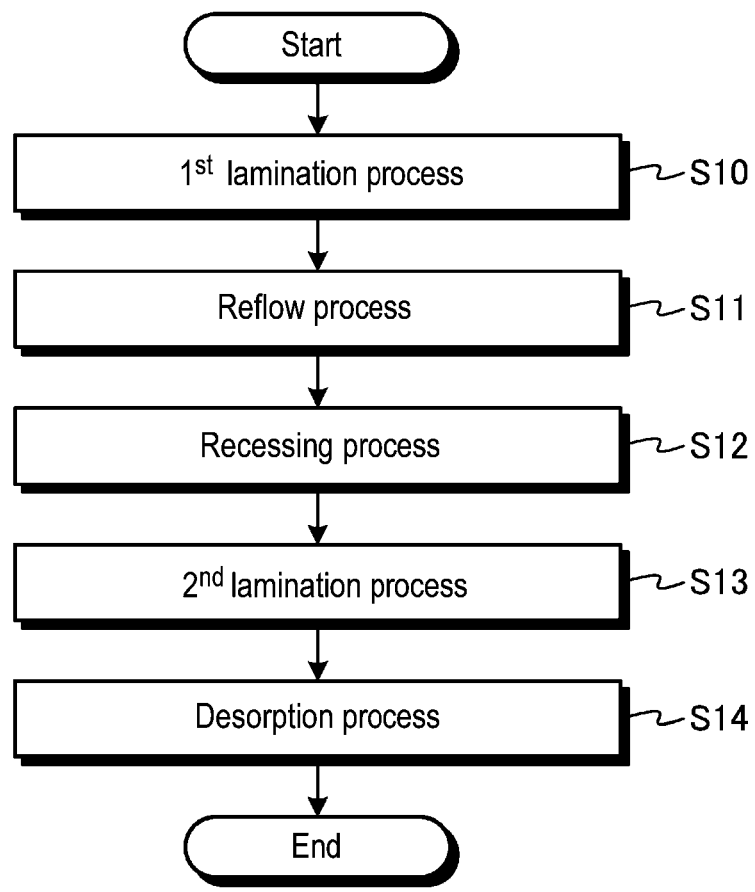
FIG. 5 is a flowchart illustrating an example of a method of manufacturing a semiconductor device.
Figure 6:
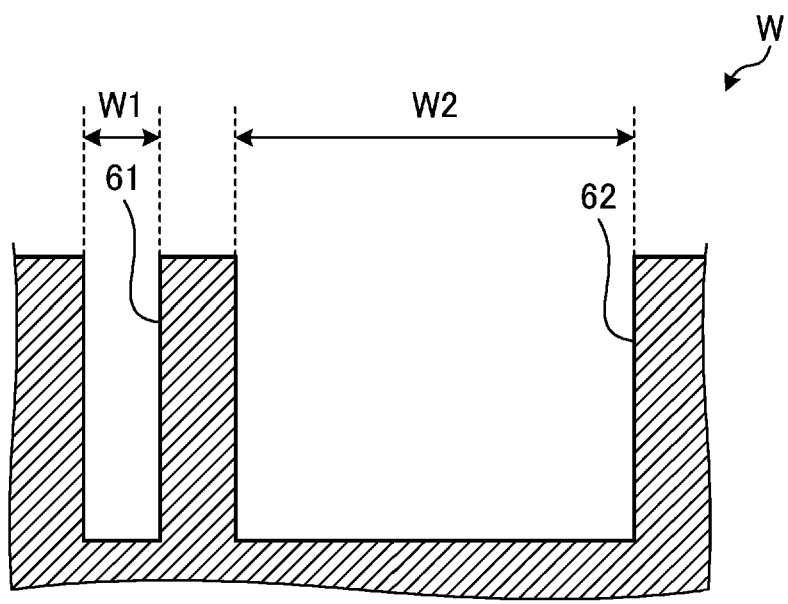
FIG. 6 is a view illustrating an example of a manufacturing process of a semiconductor device.

FIG. 5 is a flowchart illustrating an example of a method of manufacturing a semiconductor device. As a substrate W in which a recess 61 and a recess 62 having different widths are formed, as illustrated, for example, in FIG. 6, is carried into the laminating apparatus 200 by the transport mechanism 106, the process illustrated in FIG. 5 is initiated. In the example of FIG. 6, a width W2 of the recess 62 is wider than a width W1 of the recess 61. The recess 61 is an example of the first recess, and the recess 62 is an example of the second recess.

Figure 7:
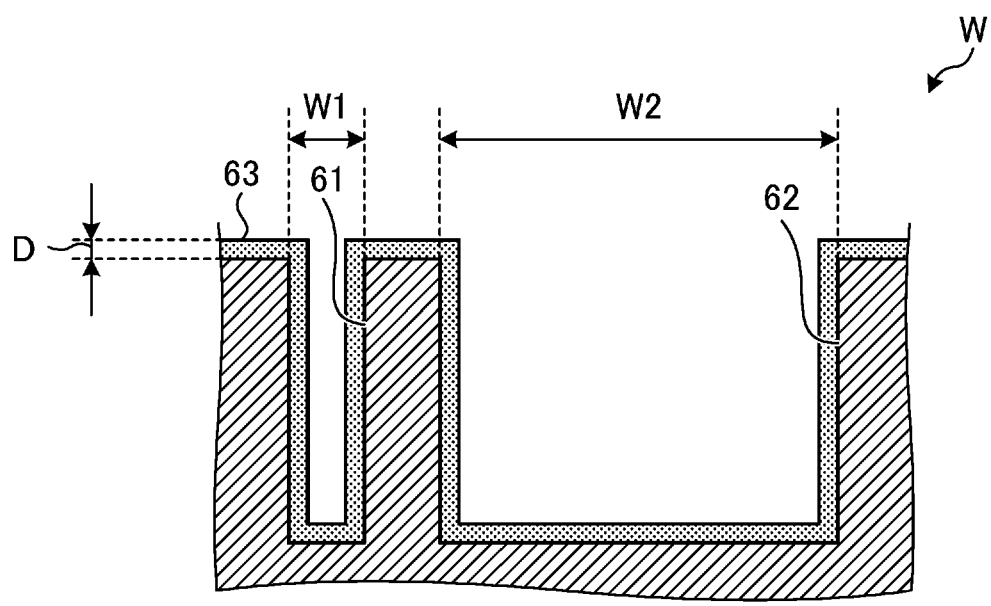
FIG. 7 is a view illustrating an example of a manufacturing process of a semiconductor device.

First, the laminating apparatus 200 executes a first lamination process (S10). In step S10, a thermally decomposable organic material is laminated on the substrate W in a state in which the substrate W is heated to a temperature in a range of, for example, 60 degrees C. to 100 degrees C. As a result, as illustrated, for example, in FIG. 7, an organic material 63 having a thickness D is laminated on the substrate W. In the present embodiment, the thickness D is a thickness of ¼ or less of the width W2 of the wider recess 62. Then, the substrate W is carried out from the laminating apparatus 200 by the transport mechanism 106, and is carried into the heating apparatus 300-1.

Next, a reflow process is executed by the heating apparatus 300-1 (S11). In step S11, the substrate W is heated by the heating apparatus 300-1 to a temperature in a range of, for example, 180 degrees C. to 300 degrees C. A heating time in step S11 is a duration of time corresponding to the temperature. For example, at 180 degrees C., the heating time is 10 minutes or more and at 300 degrees C., the heating time is within 30 seconds. As a result, the organic material 63 laminated on the substrate W is fluidized. Then, the organic material 63 laminated on a side wall of the recess 61 flows into a bottom of the recess 61, and the organic material 63 laminated on a side wall of the recess 62 flows into a bottom of the recess 62. As a result, as illustrated, for example, in FIG. 8, the organic material 63 having a thickness of D1 is laminated on the bottom of the recess 61, and the organic material 63 having a thickness of D2 is laminated on the bottom of the recess 62.

Figure 8:
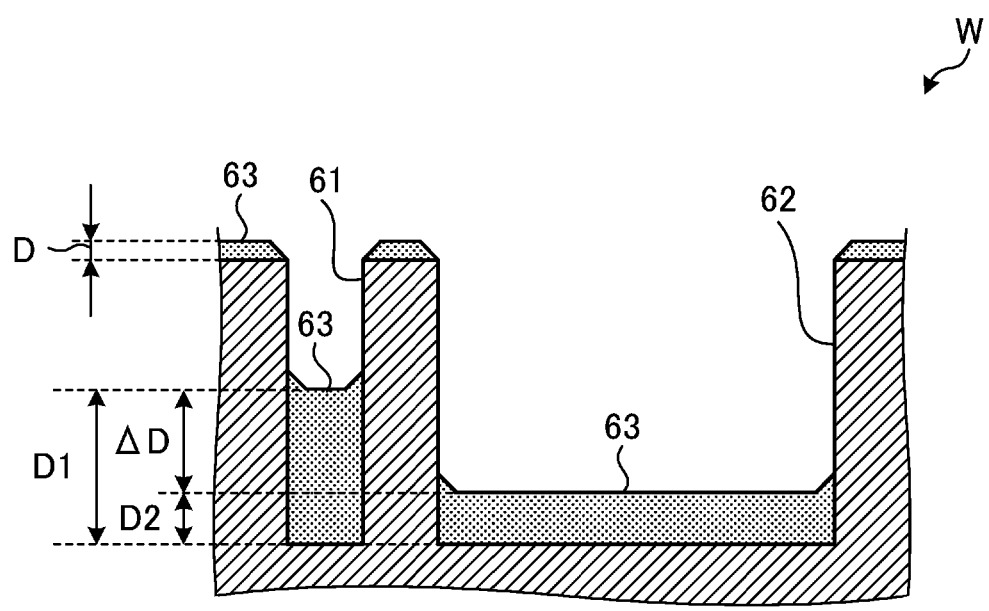
FIG. 8 is a view illustrating an example of a manufacturing process of a semiconductor device.

Here, in the present embodiment, the thickness D of the organic material 63 laminated on the substrate W in step S10 is ¼ or less of the width W2 of the recess 62, which is wider than the recess 61. In addition, a ratio of an area of the side wall of the recess 61 to a volume of the recess 61 is different from a ratio of an area of the side wall of the recess 62 to a volume of the recess 62. In the example of FIG. 8, the ratio of the area of the side wall of the recess 61 to the volume of the recess 61 is smaller than the ratio of the area of the side wall of the recess 62 to the volume of the recess 62. Therefore, the thickness D1 of the organic material 63 flowing from the side wall of the recess 61 to the bottom of the recess 61 is greater than the thickness D2 of the organic material 63 flowing from the side wall of the recess 62 to the bottom of the recess 62. In the example of FIG. 8, a difference between the thickness D1 and the thickness D2 is ΔD. Further, as illustrated, for example, in FIG. 8, the organic material 63 having a thickness D remains on the substrate W near the recess 61 and the recess 62.

Figure 9:
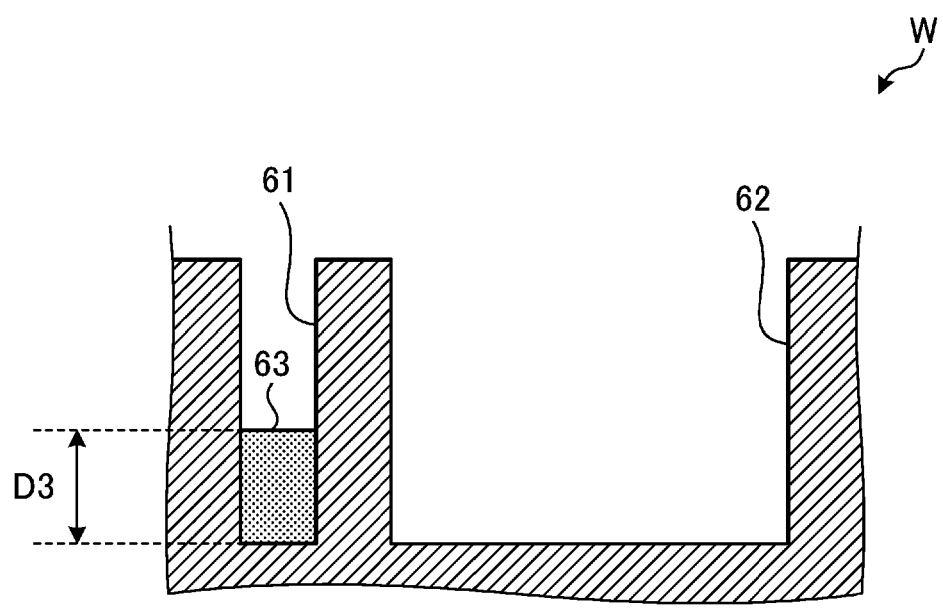
FIG. 9 is a view illustrating an example of a manufacturing process of a semiconductor device.

Next, a recessing process is executed by the heating apparatus 300-1 (S12). In step S12, the substrate W is heated by the heating apparatus 300-1 to a temperature in a range of, for example, 240 degrees C. to 300 degrees C. As a result, the organic material 63 from a top surface thereof to a depth in accordance with the temperature and heating time of the substrate W is thermally decomposed and desorbed from the substrate W. In the present embodiment, the temperature and heating time of the substrate W are adjusted such that the organic material 63 having a thickness of D2 or more is thermally decomposed. As a result, as illustrated, for example, in FIG. 9, the organic material 63, which has flowed into the bottom of the recess 62 and the organic material 63, which has remained on the substrate W near the recess 61 and the recess 62, are removed. Even in the recess 61, since some of the organic material 63, which has flowed into the bottom of the recess 61 and has the thickness D1, is thermally decomposed, the organic material 63 having a thickness D3 smaller than the thickness D1 remains in the bottom of the recess 61. Then, the substrate W is carried out from the heating apparatus 300-1 and carried into the plasma processing apparatus 400 by the transport mechanism 106.

Figure 10:
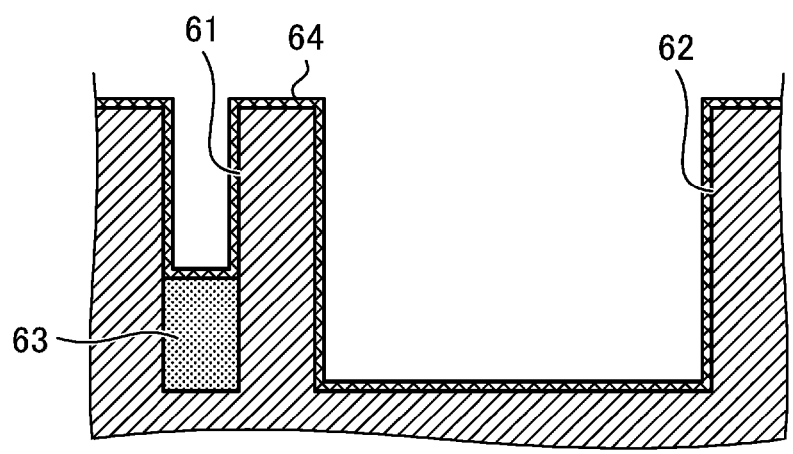
FIG. 10 is a view illustrating an example of a manufacturing process of a semiconductor device.

Next, the plasma processing apparatus 400 executes a second lamination process (S13). In step S13, a sealing film is laminated on the substrate W using microwave plasma. As a result, as illustrated, for example, in FIG. 10, a sealing film 64 is laminated on the organic material 63 in the recess 61 in the substrate W. Then, the substrate W is carried out from the plasma processing apparatus 400 and carried into the heating apparatus 300-2 by the transport mechanism 106.

Figure 11:
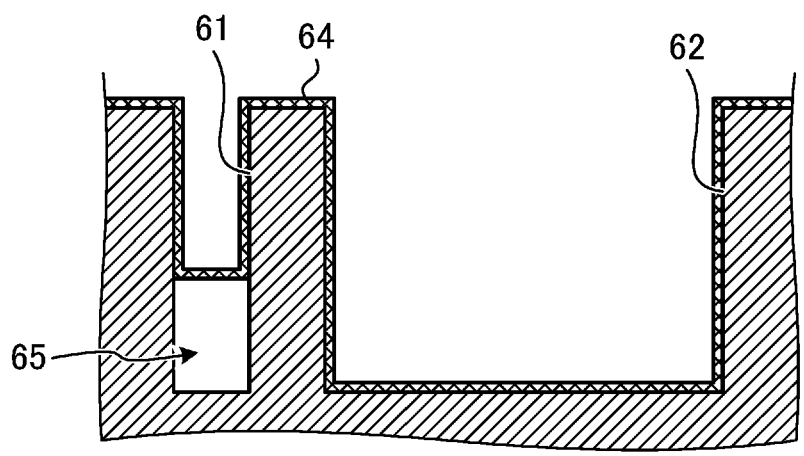
FIG. 11 is a view illustrating an example of a manufacturing process of a semiconductor device.

Next, a desorption process is executed by the heating apparatus 300-2 (S14). In step S14, the substrate W is heated to a temperature of, for example, 300 degrees C. or higher, by the heating apparatus 300-2. The temperature of 300 degrees C. or higher is an example of the second temperature. As a result, the organic material 63 of a lower layer of the sealing film 64 is thermally decomposed and desorbed through the sealing film 64. As a result, as illustrated in FIG. 11, for example, in the recess 61, under the lower layer of the sealing film 64, an air gap 65 corresponding to a shape of the organic material 63 is formed. Then, the substrate W is carried out from the heating apparatus 300-2 by the transport mechanism 106, and the process illustrated in this flowchart is terminated.

In addition, steps S10 to S12 may be repeated multiple times in that order. As a result, the organic material 63 in the recess 62 can be removed and also, the thickness D1 of the organic material 63 in the recess 61 can be increased.

[Relationship Between Temperature, Pressure, and D/R]

Figure 12:
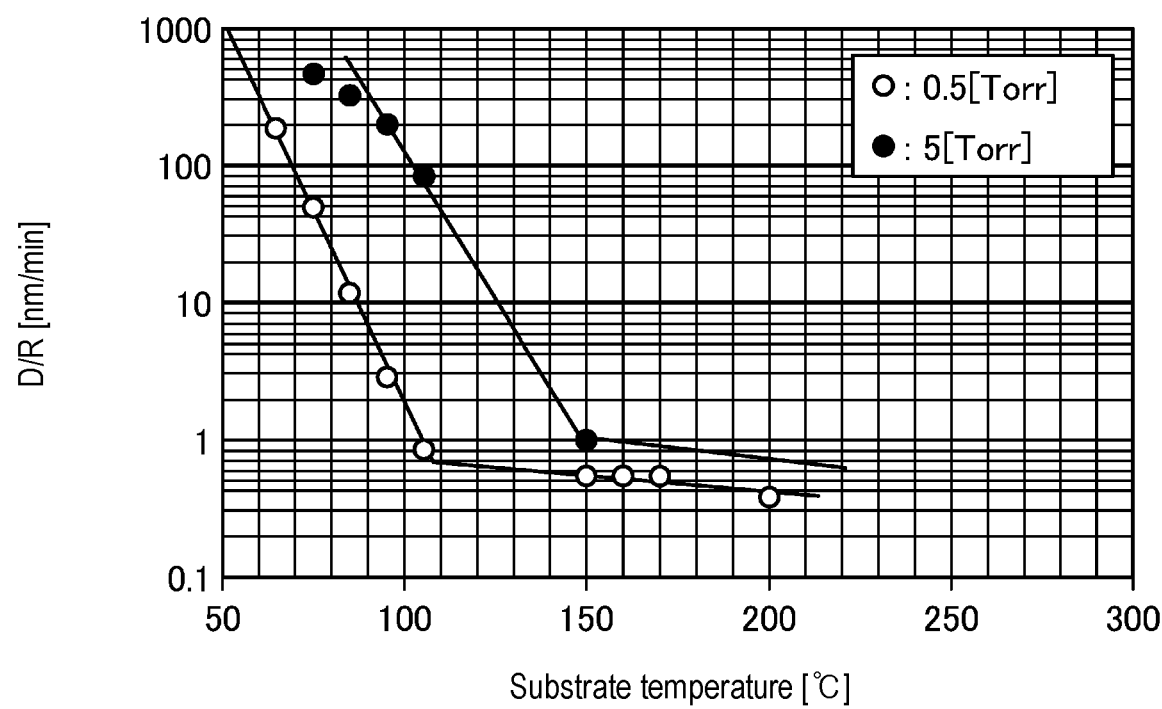
FIG. 12 is a diagram showing an example of a relationship among temperature, pressure, and deposition rate (D/R) when an organic material is laminated on a substrate.

FIG. 12 is a diagram showing an example of a relationship among a temperature, pressure, and D/R (deposition rate) when an organic material 63 is laminated on a substrate. When the organic material 63 is laminated on the substrate W, as illustrated, for example, in FIG. 12, the D/R of the organic material 63 tends to decrease when the temperature of the substrate W increases. With a D/R of less than 1 nm/min, when a measurement error is accounted for, it may be assumed that almost no film is formed. Therefore, when the pressure in the container 301 containing the substrate W is 0.5 Torr, it is preferable to laminate the organic material 63 in a state in which the substrate W is heated to a temperature in a range of, for example, 60 degrees C. to 100 degrees C.

Further, when the pressure in the container 301 containing the substrate W increases, the D/R of the organic material 63 tends to increase. From the perspective of increasing a throughput in laminating the organic material 63, increasing the pressure in the container 301 can be considered.

Further, as shown, for example, in FIG. 12, when the temperature of the substrate W is 180 degrees C. or higher, the D/R is almost zero. In a region in which the temperature of the substrate W is 180 degrees C. or higher, the organic material 63 is not laminated, but it is considered that the organic material 63 is fluidized.

[Relationship Between Temperature, Pressure, and Recessing Rate]

Figure 13:
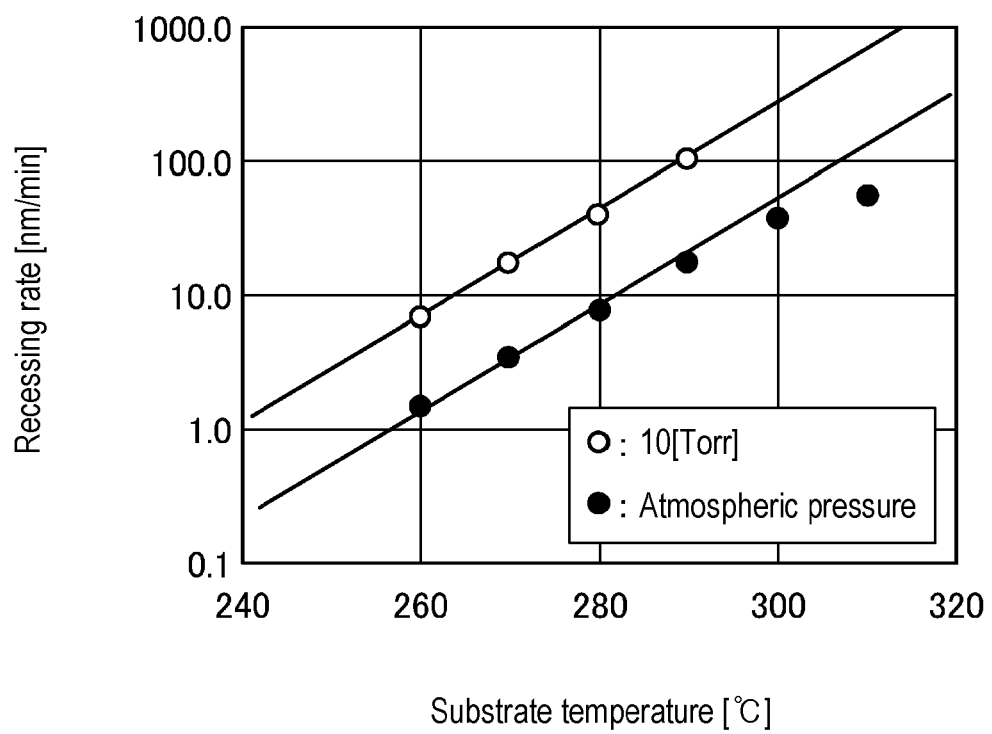
FIG. 13 is a diagram showing an example of a relationship among temperature, pressure, and recessing rate of a substrate.

FIG. 13 is a diagram showing an example of a relationship among a temperature, pressure, and recessing rate of a substrate W. When the temperature of the substrate W on which the organic material 63 is laminated becomes high, as shown, for example, in FIG. 13, the thermal decomposition of the organic material 63 proceeds, and a recessing rate of the organic material 63 tends to increase. With a D/R of less than 1 nm/min, when a measurement error is accounted for, it may be assumed that there is almost no recessing. Therefore, when the pressure in the container 301 containing the substrate W is 10 Torr, it is preferable to recess the organic material 63 in a state in which the substrate W is heated to a temperature in a range of, for example, 240 degrees C. to 300 degrees C.

Further, when the pressure in the container 301 containing the substrate W increases, the recessing rate of the organic material 63 tends to decrease. From the perspective of increasing a throughput in recessing the organic material 63, decreasing the pressure in the container 301 can be considered.

In addition, as shown, for example, in FIG. 13, in the case in which the pressure in the container 301 is 10 Torr, when the temperature of the substrate W becomes 240 degrees C. or less, the recessing rate becomes less than 1 nm/min in view of the tendency for the recessing rate to change with the temperature. In a region in which the temperature of the substrate W is 240 degrees C. or lower, the organic material 63 is hardly recessed, but it is considered that the organic material 63 is fluidized. Therefore, it is possible to fluidize the organic material 63 by heating the substrate W to a temperature in a range of, for example, 180 degrees C. to 300 degrees C. Further, the heating time for fluidizing the organic material 63 is a duration of time corresponding to the temperature. For example, at 180 degrees C., the heating time is 10 minutes or more, and at 300 degrees C., for example, the heating time is within 30 seconds.

In the foregoing, embodiments have been described. As described above, the method of manufacturing a semiconductor device in the present embodiment includes a first lamination process, a reflow process, and a recessing process. In the first lamination process, a material gas is supplied into the container 301 in which a substrate W having a recess 61 and a recess 62, which has a wider width than a width of the recess 61, is accommodated, so that a thermally decomposable organic material 63 is laminated on the substrate W. In the reflow process, the substrate W is heated to a first temperature and thus, the organic material 63 laminated on the substrate W is fluidized. The first temperature is a temperature in a range of, for example, 180 degrees C. to 300 degrees C. The heating time at the first temperature is a duration of time corresponding to the temperature. For example, at 180 degrees C., the heating time is 10 minutes or more, and at 300 degrees C., for example, the heating time is within 30 seconds. In the recessing process, the organic material 63 laminated in the recess 62 is removed. As a result, it is possible to selectively laminate the organic material 63 in the recess 61 having a narrower width rather than in the recess 62 having a wider width.

Further, the method of manufacturing a semiconductor device in the above-described embodiments further includes a second lamination process and a desorption process. In the second lamination process, a sealing film 64 is laminated on the organic material 63 laminated in the recess 61. In the desorption process, the substrate W is heated to a second temperature which is higher than the first temperature, so that the organic material 63 of a lower layer of the sealing film 64 is thermally decomposed. Then, the organic material 63 of the lower layer of the sealing film 64 is desorbed through the sealing film 64, and thus, an air gap 65 is formed between the sealing film 64 and the recess 61. The second temperature is a temperature of, for example, 300 degrees C. or higher. As a result, the air gap 65 can be easily formed in the recess 61 having a narrower width rather than in the recess 62 having a wider width.

Further, in the first lamination process of the above-described embodiments, the thermally decomposable organic material 63 is laminated on the substrate W in a state in which the substrate W is heated to a third temperature which is lower than the first temperature. The third temperature is a temperature in a range of, for example, 60 degrees C. to 100 degrees C. Therefore, it is possible to laminate the organic material 63 on the substrate W.

In addition, in the recessing process of the above-described embodiments, the substrate W is heated to a fourth temperature, which is equal to or higher than the first temperature, and thus, the organic material 63 laminated in the recess 62 is removed. The fourth temperature is a temperature in a range of, for example, 240 degrees C. to 300 degrees C. As a result, it is possible to suppress the formation of an air gap 65 in the recess 62, which has a wider width than that of the recess 61.

Further, in the first lamination process of the above-described embodiments, the organic material 63 is laminated on the substrate W to a thickness D of ¼ or less of the width W2 of the recess 62. As a result, it is possible to make the thickness D2 of the organic material 63, which has flowed into the bottom of the recess 62 to be less than the thickness D1 of the organic material 63 that has flowed into the bottom of the recess 61. In addition, by performing the recessing process, it is possible to suppress the formation of an air gap 65 in the recess 62, which has a wider width than that of the recess 61.

Further, in the above-described embodiments, the first lamination process, the reflow process, and the recessing process may be repeated multiple times in that order. As a result, it is possible to remove the organic material 63 in the recess 62, and to increase the thickness D1 of the organic material 63 in the recess 61.

[Others]

The technology disclosed herein is not limited to the embodiments described above, and various modifications are possible within the scope of the gist of the present disclosure.

For example, in the above-described embodiments, the manufacturing system 10 includes a laminating apparatus 200, a heating apparatus 300-1, a plasma processing apparatus 400, and a heating apparatus 300-2, but the technique disclosed herein is not limited thereto. A plurality of at least one of the laminating apparatus 200, the heating apparatus 300-1, the plasma processing apparatus 400, and the heating apparatus 300-2 may be provided in the manufacturing system 10. In particular, in some embodiments, the manufacturing system 10 is provided with a large number of apparatuses that take more time to perform processing than other apparatuses. As a result, it is possible to reduce processing bottlenecks. Further, the heating device 300-1 and the heating device 300-2 may be realized by one heating device 300.

In the above-described embodiments, the recessing process is implemented by heating the substrate W using the heating apparatus 300-1, but the technique disclosed herein is not limited thereto, and may be performed using plasma such as capacitively coupled plasma (CCP). As the processing gas in this case, a $H_2$ gas or an $O_2$ gas, for example, may be used.

Figure 14:
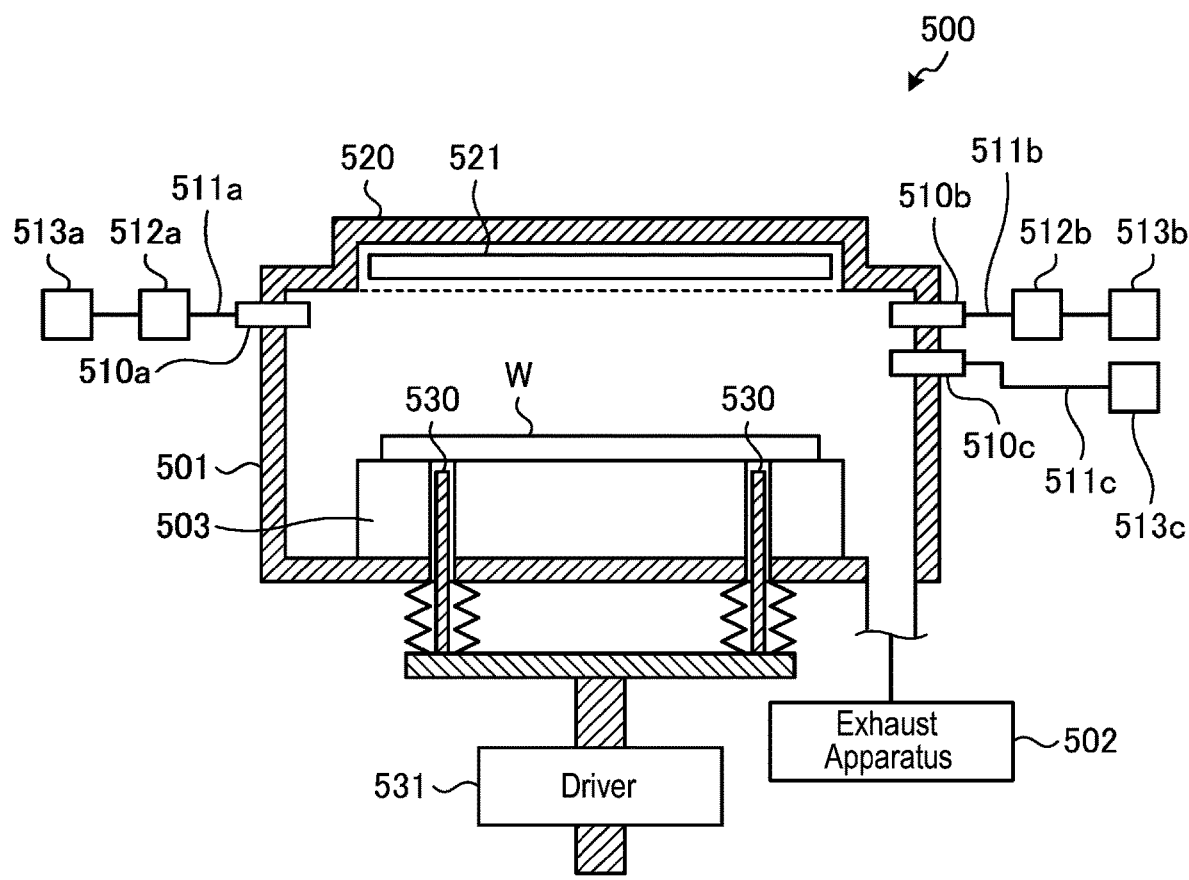
FIG. 14 is a schematic diagram illustrating an example of a film forming apparatus.

Further, in the above-described embodiments, the manufacturing system 10 separately includes each of the laminating apparatus 200 and the heating apparatus 300-1, but the technique disclosed herein is not limited thereto. In some embodiments, the manufacturing system 10 may include a film forming apparatus 500 that performs the function of the laminating apparatus 200 and the function of the heating apparatus 300-1, as illustrated, for example, in FIG. 14. FIG. 14 is a schematic diagram illustrating an example of the film forming apparatus 500.

The film forming apparatus 500 includes a container 501. Inside of the container 501 is controlled to a vacuum atmosphere having a predetermined pressure by an exhaust apparatus 502. A supply port 510a, a supply port 510b, and a supply port 510c are provided in a side wall of the container 501.

A raw material supply source 513a is connected to the supply port 510a via a supply pipe 511a. A raw material supply source 513b is connected to the supply port 510b via a supply pipe 511b. The raw material supply source 513a and the raw material supply source 513b contain different raw material monomers as liquids. The raw material supply source 513a contains, for example, an isocyanate liquid, and the raw material supply source 513b contains, for example, an amine liquid.

A vaporizer 512a is provided in the supply pipe 511a between the supply port 510a and the raw material supply source 513a, and the raw material monomer supplied from the raw material supply source 513a is vaporized by the vaporizer 512a and supplied from the supply port 510a into the container 501. A vaporizer 512b is provided in the supply pipe 511b between the supply port 510b and the raw material supply source 513b, and the raw material monomer supplied from the raw material supply source 513b is vaporized by the vaporizer 512b and supplied from the supply port 510b into the container 501.

A gas supply source 513c, which is a supply source of an inert gas such as $N_2$ gas, is connected to the supply port 510c via a supply pipe 511c. The gas supply source 514 supplies the inert gas into the container 501 via the supply pipe 511c and the supply port 510c.

Inside the container 501, a stage 503 having a temperature control mechanism (not illustrated) is provided so that a substrate W is placed thereon. The stage 503 heats the substrate W to a first temperature (e.g., a temperature in a range of 60 degrees C. to 100 degrees C.).

A lamp house 520 is provided at a position facing a surface of the stage 503 on which the substrate W is placed. An infrared lamp 521 is disposed in the lamp house 520. The infrared lamp 521 heats the substrate W.

Multiple through holes are formed in the stage 503, and lift pins 530 are disposed in the through holes, respectively. Each lift pin 530 is driven up and down by a driver 531. The substrate W is moved up and down by driving multiple lift pins 530 up and down.

In the first lamination process, the substrate W having recesses with different widths formed in the surface thereof is carried into the container 501 by the transport mechanism 106 and placed on the stage 503. Then, the substrate W is heated to the first temperature by the stage 503, and multiple types of raw material monomers are supplied into the container 501 from the supply port 510a and the supply port 510b. As a result, an organic material is laminated on the surface of the substrate W in which the recesses are formed. Then, the supply of the raw material monomers from the supply port 510a and the supply port 510b is stopped.

Figure 15:
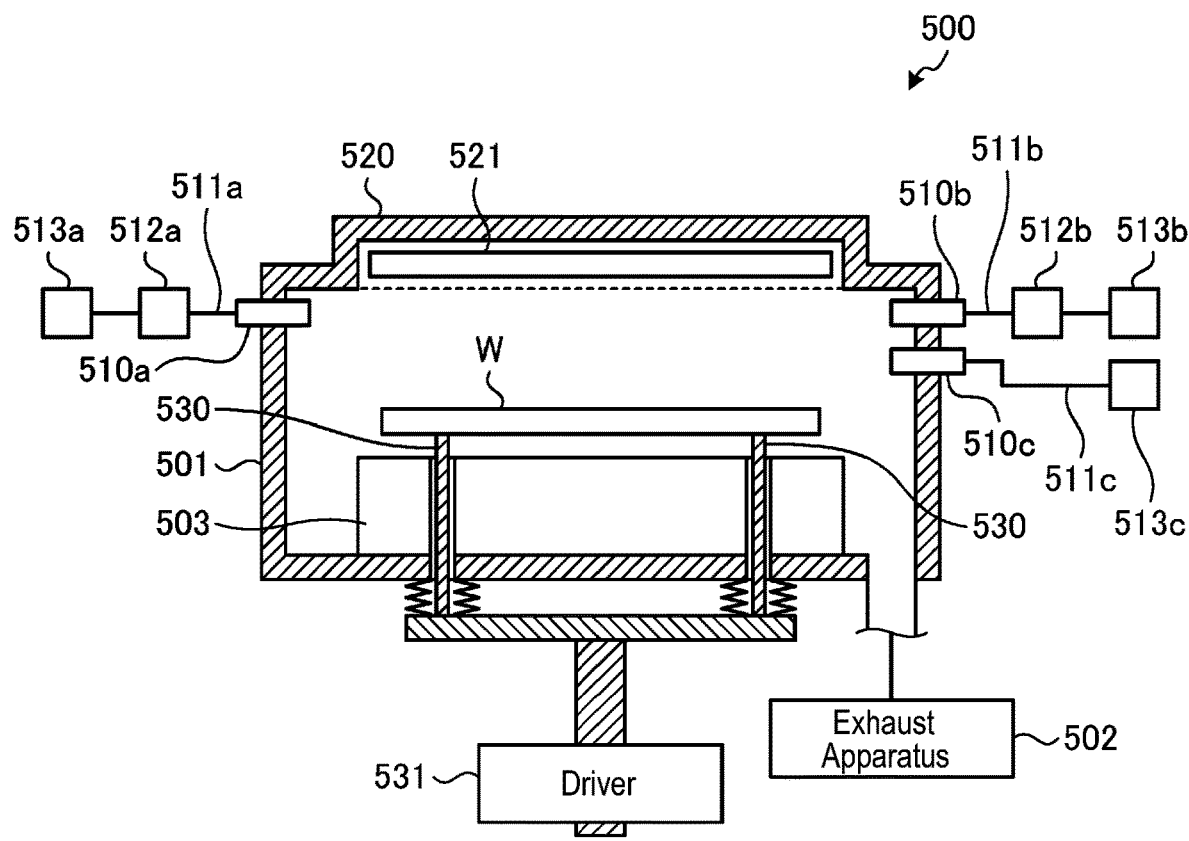
FIG. 15 is a schematic diagram illustrating an example of a film forming apparatus.

In the reflow process, an inert gas is supplied into the container 501 from the supply port 510c. Then, as illustrated, for example, in FIG. 15, when the lift pins 530 are raised by driving of the driver 531, the substrate W is raised, and the substrate W and the stage 503 are separated from each other. Then, the substrate W is heated to a first temperature (e.g., a temperature in the range of 180 degrees C. to 300 degrees C.) by the lamp house 520. When the substrate W is raised by the lift pins 530, the substrate W and the stage 503 are separated from each other. Thus, it is possible to quickly heat the substrate W to a target temperature using the infrared lamp 521. Further, when the substrate W is raised by the lift pins 530, the substrate W approaches the infrared lamp 521. Thus, it is possible to quickly heat the substrate W to a target temperature using the infrared lamp 521.

In the recessing process, in a state in which the substrate W is raised by the lift pins 530, the substrate W is heated to a fourth temperature (e.g., a temperature in a range of 240 degrees C. to 300 degrees C.) using the infrared lamp 521. Then, the substrate W is carried out from the heating apparatus 300-1 and carried into the plasma processing apparatus 400 by the transport mechanism 106. By using the film forming apparatus 500 having this configuration, it is possible to shorten the total processing time of the first lamination process, the reflow process, and the recessing process. In addition, it is possible to reduce an installation area (footprint) of the manufacturing system 10.

Further, in the above-described embodiments, a polymer having a urea bond was used as an example of the polymer constituting the organic material, but as the polymer constituting the organic material, a polymer having a bond other than the urea bond may be used. The polymer having a bond other than the urea bond may be, for example, polyurethane having a urethane bond. Polyurethane may be synthesized, for example, by copolymerizing a monomer having an alcohol group and a monomer having an isocyanate group. In addition, the polyurethane is depolymerized into a monomer having an alcohol group and a monomer having an isocyanate group by being heated to a predetermined temperature.

Further, in the above-described embodiments, a thermally decomposable organic material is used to form an air gap, but the technique disclosed herein is not limited thereto. For example, in processing a semiconductor device, the technique disclosed herein is also applicable when a protective film using a thermally decomposable organic material is formed in an area where a wiring spacing is narrow in order to process an area where a wiring spacing is wide. In this case, when the reflow process is performed after an organic material is formed on the entire substrate W to a thickness of about ⅓ of the width of the recess in the area in which the wiring spacing is narrow, the organic material flows into the bottom of the recess in the area in which the wiring spacing is narrow, and an organic material having a thickness of about ⅔ of the depth of the recess is formed. On the other hand, the thickness of the organic material on the bottom of the recess in the area, in which the wiring spacing is wider, is much smaller than the thickness of the organic material on the bottom of the recess in the area in which the wiring spacing is narrow. Therefore, by performing the recess process, it is possible to selectively laminate the organic material only in the recess in the area in which the wiring spacing is narrow.

According to the various aspects and embodiments of the present disclosure, it is possible to selectively form a film in a recess having a narrow width rather than in a recess having a wide width.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising:
   laminating a thermally decomposable organic material on a substrate by supplying a material gas into a container in which the substrate having a first recess and a second recess, which has a wider width than a width of the first recess, are formed;
   fluidizing the organic material laminated on the substrate by heating the substrate to a first temperature;
   removing the organic material laminated in the second recess;
   laminating a sealing film on the organic material laminated in the first recess; and
   forming an air gap between the sealing film and the first recess by heating the substrate to a second temperature which is higher than the first temperature so as to thermally decompose the organic material of a lower layer of the sealing film, and by desorbing, through the sealing film, the organic material of the lower layer of the sealing film.

2. The method of claim 1, wherein laminating the thermally decomposable organic material comprises laminating the thermally decomposable organic material on the substrate in a state in which the substrate is heated to a third temperature, which is lower than the first temperature.

3. The method of claim 2, wherein removing the organic material comprises heating the substrate to a fourth temperature, which is equal to or higher than the first temperature, so that the organic material laminated in the second recess is removed.

4. The method of claim 3, wherein laminating the thermally decomposable organic material comprises laminating the organic material on the substrate with a thickness of ¼ or less of the width of the second recess.

5. The method of claim 4, wherein laminating the thermally decomposable organic material, fluidizing the organic material, and removing the organic material are repeated multiple times in this order.

6. The method of claim 1, wherein, laminating the thermally decomposable organic material comprises laminating the thermally decomposable organic material on the substrate in a state in which the substrate is heated to a third temperature, which is lower than the first temperature.

7. The method of claim 1, wherein removing the organic material comprises heating the substrate to a fourth temperature, which is equal to or higher than the first temperature, so that the organic material laminated in the second recess is removed.

8. The method of claim 1, wherein laminating the thermally decomposable organic material comprises laminating the organic material on the substrate with a thickness of ¼ or less of the width of the second recess.

9. The method of claim 1, wherein laminating the thermally decomposable organic material, fluidizing the organic material, and removing the organic material are repeated multiple times in this order.

* * * * *